(12) United States Patent
Nagata et al.

(10) Patent No.: US 10,324,110 B2
(45) Date of Patent: Jun. 18, 2019

(54) PROBE COVER

(71) Applicant: YOKOWO CO., LTD., Kita-ku, Tokyo (JP)

(72) Inventors: Takahiro Nagata, Tomioka (JP); Yoshiji Miyashita, Tomioka (JP); Katsuo Miki, Tomioka (JP); Kazumi Ookawara, Tomioka (JP); Isao Samata, Tomioka (JP)

(73) Assignee: Yokowo Co., Ltd., Tokyo (JP)

( * ) Notice: Subject to any disclaimer, the term of this patent is extended or adjusted under 35 U.S.C. 154(b) by 259 days.

(21) Appl. No.: 15/302,666

(22) PCT Filed: Mar. 20, 2015

(86) PCT No.: PCT/JP2015/058574
§ 371 (c)(1),
(2) Date: Oct. 7, 2016

(87) PCT Pub. No.: WO2015/156104
PCT Pub. Date: Oct. 15, 2015

(65) Prior Publication Data
US 2017/0038412 A1 Feb. 9, 2017

(30) Foreign Application Priority Data
Apr. 10, 2014 (JP) ................................ 2014-081152

(51) Int. Cl.
*G01R 31/00* (2006.01)
*G01R 1/073* (2006.01)
(Continued)

(52) U.S. Cl.
CPC ........... *G01R 1/07307* (2013.01); *G01R 1/04* (2013.01); *G01R 31/2886* (2013.01); *H01R 33/7664* (2013.01); *H01R 33/7671* (2013.01)

(58) Field of Classification Search
USPC .................... 324/756.07, 756.03, 756.04
See application file for complete search history.

(56) References Cited

U.S. PATENT DOCUMENTS 5,055,780 A * 10/1991 Takagi ................... G01R 1/04
324/72.5
7,598,727 B1 10/2009 Dang et al.
(Continued)

FOREIGN PATENT DOCUMENTS

JP H08-148535 A 6/1996
JP H11-101848 A 4/1999
(Continued)

OTHER PUBLICATIONS

Satco Nuvo Lighting S70/111 n/a Hardware & Lamp Parts Universal Crossbar.*

(Continued)

*Primary Examiner* — Vincent Q Nguyen
(74) *Attorney, Agent, or Firm* — Morgan, Lewis & Bockius LLP

(57) ABSTRACT

A probe cover which is to be attached to a socket that is configured to support a plurality of contact probes, includes: a base; two positioning pins which are disposed on the base; and at least one supporting member which is disposed on the base. The two positioning pins and the supporting member are capable of positioning the base in a state where the base is separated from the socket by a predetermined distance, and a mutual separation distance between the two positioning pins is changeable.

12 Claims, 7 Drawing Sheets

(51) Int. Cl.
*G01R 31/28* (2006.01)
*H01R 33/76* (2006.01)
*G01R 1/04* (2006.01)

(56) References Cited

U.S. PATENT DOCUMENTS

| | | |
|---|---|---|
| 2003/0112001 A1 | 6/2003 | Eldridge et al. |
| 2005/0036374 A1* | 2/2005 | Nakashima ........ G01R 31/2889 |
| | | 365/202 |
| 2006/0057875 A1 | 3/2006 | Eldridge et al. |
| 2013/0224970 A1* | 8/2013 | Sandhu .............. H01R 12/7076 |
| | | 439/68 |

FOREIGN PATENT DOCUMENTS

| | | |
|---|---|---|
| JP | 2005-514596 A | 5/2005 |
| JP | 2007-287425 A | 11/2007 |
| JP | 2011-014377 A | 1/2011 |

OTHER PUBLICATIONS

International Search Report issued in corresponding International Application No. PCT/JP2015/058574 dated Jun. 9, 2015.

* cited by examiner

CONVENTIONAL EXAMPLE

CONVENTIONAL EXAMPLE

PROBE COVER

TECHNICAL FIELD

The present invention relates to a probe cover which is to be attached to a socket that supports a plurality of contact probes.

BACKGROUND ART

For example, a contact probe is used for electrically connecting an inspection object such as a semiconductor integrated circuit with an inspection substrate on the side of a measuring apparatus. Under inspection, usually, a socket which supports a plurality of contact probes is fixed to an inspection substrate, and the socket is pressed against an inspection object. At this time, one end of each contact probe is contacted with corresponding electrode of the inspection substrate, and the other end thereof is contacted with corresponding electrode (for example, solder bumps) of the inspection object. In packaged state for shipping or unused state (stored state) of such a socket, in order to protect the tip ends of the contact probes which are projected from the socket, a probe cover is attached to the socket. In the present state of the art, the probe cover is fixed to the socket by screwing. For example, screwing is performed in four to six portions. FIGS. 15 and 16 illustrate a state where a conventional probe cover 801 is screwed to a socket 900 in four portions.

CITATION LIST

Patent Literature

Patent Literature 1: JP-A-2011-14377

SUMMARY OF INVENTION

Technical Problem

When a probe cover is to be fixed to a socket by screwing, a plurality of holes of the probe cover and those of the socket must be mutually coaxial. On the other hand, sockets have various shapes, and the positions of holes which can be used in screwing are different depending on type of the socket. Currently, therefore, probe covers which conform to respective sockets are custom-designed. However, there are problems in that many design man-hours are required and thus lead high cost for the production.

The present invention has been conducted in view of such circumstances. It is an object of the present invention to provide a probe cover which can be attached to a plurality of sockets having different shapes.

Solution to Problem

An aspect according to the present invention is a probe cover. The probe cover is a probe cover which is to be attached to a socket that is configured to support a plurality of contact probes, the probe cover comprising a base; two positioning pins which are disposed on the base; and at least one supporting member which is disposed on the base, wherein the two positioning pins and the supporting member are capable of positioning the base in a state where the base is separated from the socket by a predetermined distance, and a mutual separation distance between the two positioning pins is changeable.

Preferably, the mutual separation distance is selectable from continuous values.

The base may include guiding portions which are configured to slidably support the two positioning pins, respectively.

Preferably, both the guide portions are disposed on a same linear line.

Preferably, the probe cover further includes a locking unit which is configured to lock one of the two positioning pins at an arbitrary sliding position.

Preferably, the base has a plurality of mounting holes, and the supporting member is attachable to an arbitral one of the mounting holes.

Preferably, two supporting members are included, and the two supporting members are placeable respectively on both sides of a linear line passing through the two positioning pins.

Preferably, the base has a disk-like shape.

Preferably, the base is transparent.

Arbitrary combinations of the above-described components, and modes realized by converting expressions of the invention between a method, a system, and the like are also effective as aspects according to the present invention.

Advantageous Effects of Invention

According to the present invention, it is possible to provide a probe cover which can be attached to a plurality of sockets having different shapes.

DESCRIPTION OF EMBODIMENTS

Figure 1:
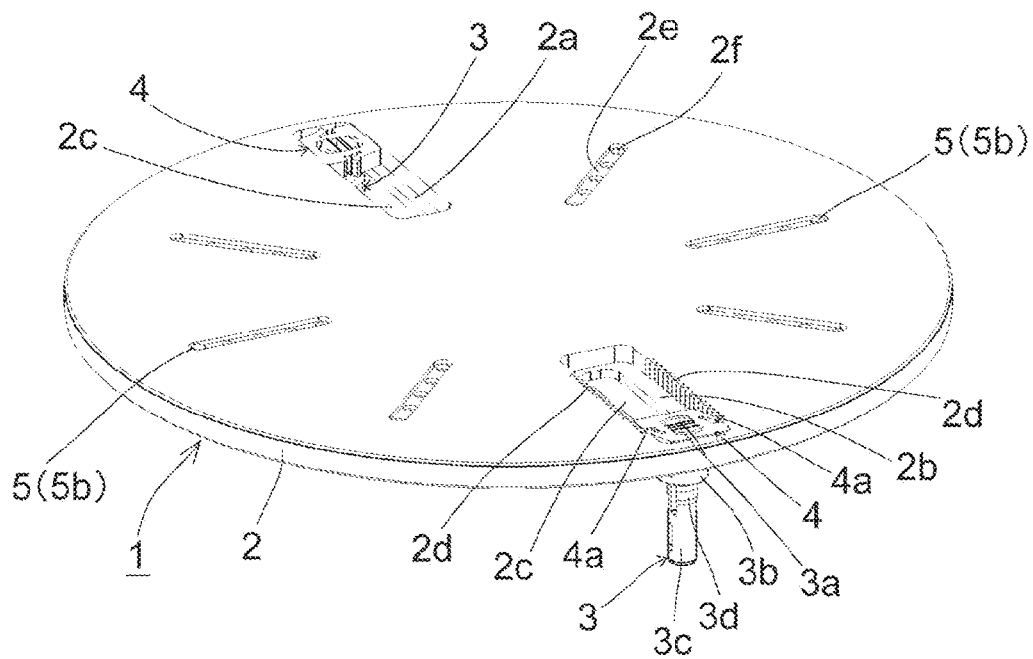
FIG. 1 is a perspective view of a probe cover 1 according to an embodiment of the present invention as seen from the upper side.

Hereinafter, a preferred embodiment of the present invention will be described in detail with reference to the drawings. The identical or equivalent components, members, and the like illustrated in the drawings are denoted by the same reference numerals, and duplicated description is adequately omitted. The embodiment is not intended to limit the invention but is a mere example, and all features described in the embodiment, and combinations thereof are not always essential to the invention.

Figure 2:
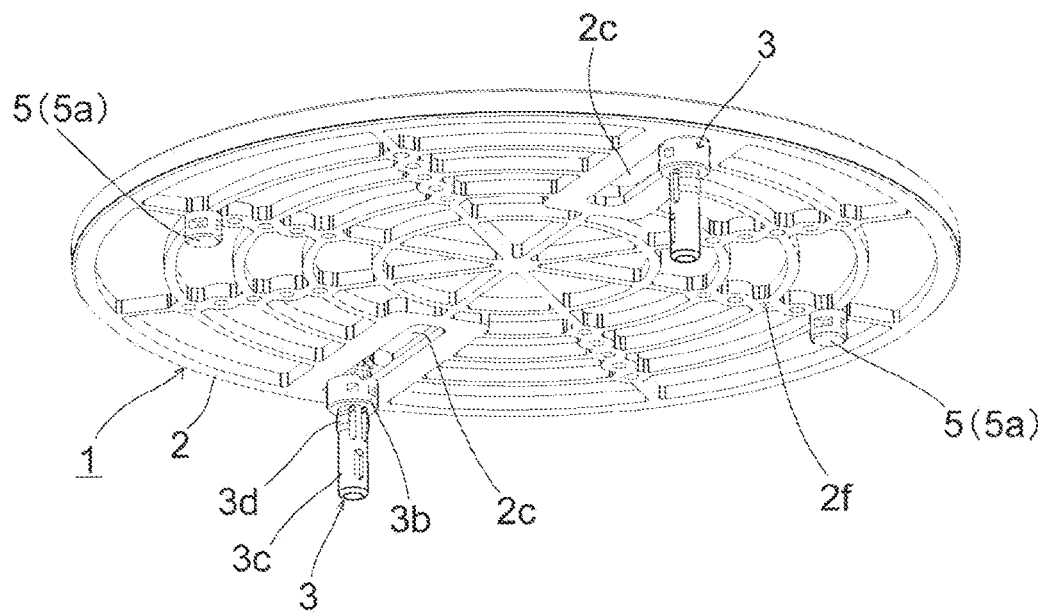
FIG. 2 is a perspective view of the probe cover 1 as seen from the lower side.
Figure 3:
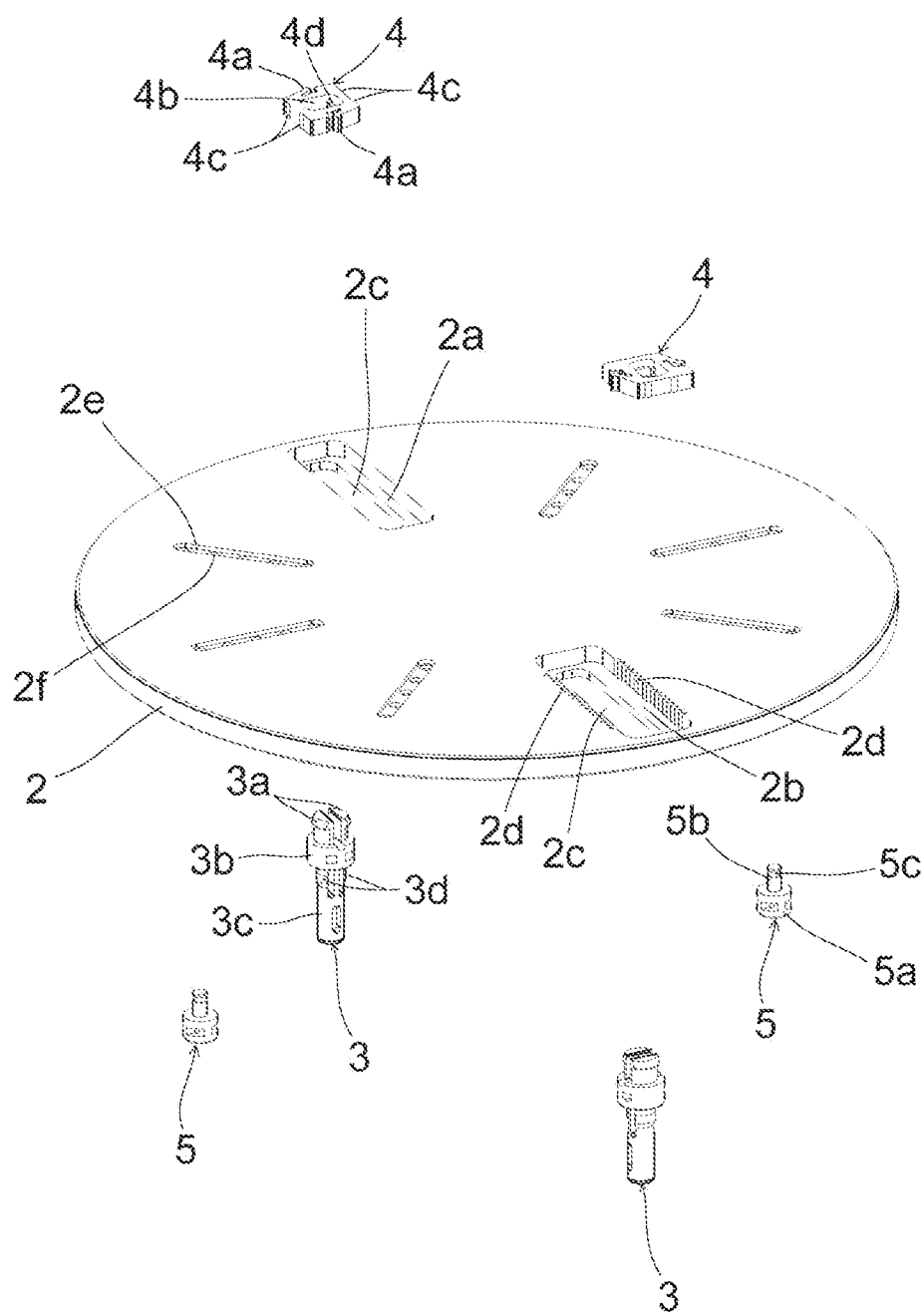
FIG. 3 is an exploded perspective view of the probe cover 1 as seen from the upper side.
Figure 4:
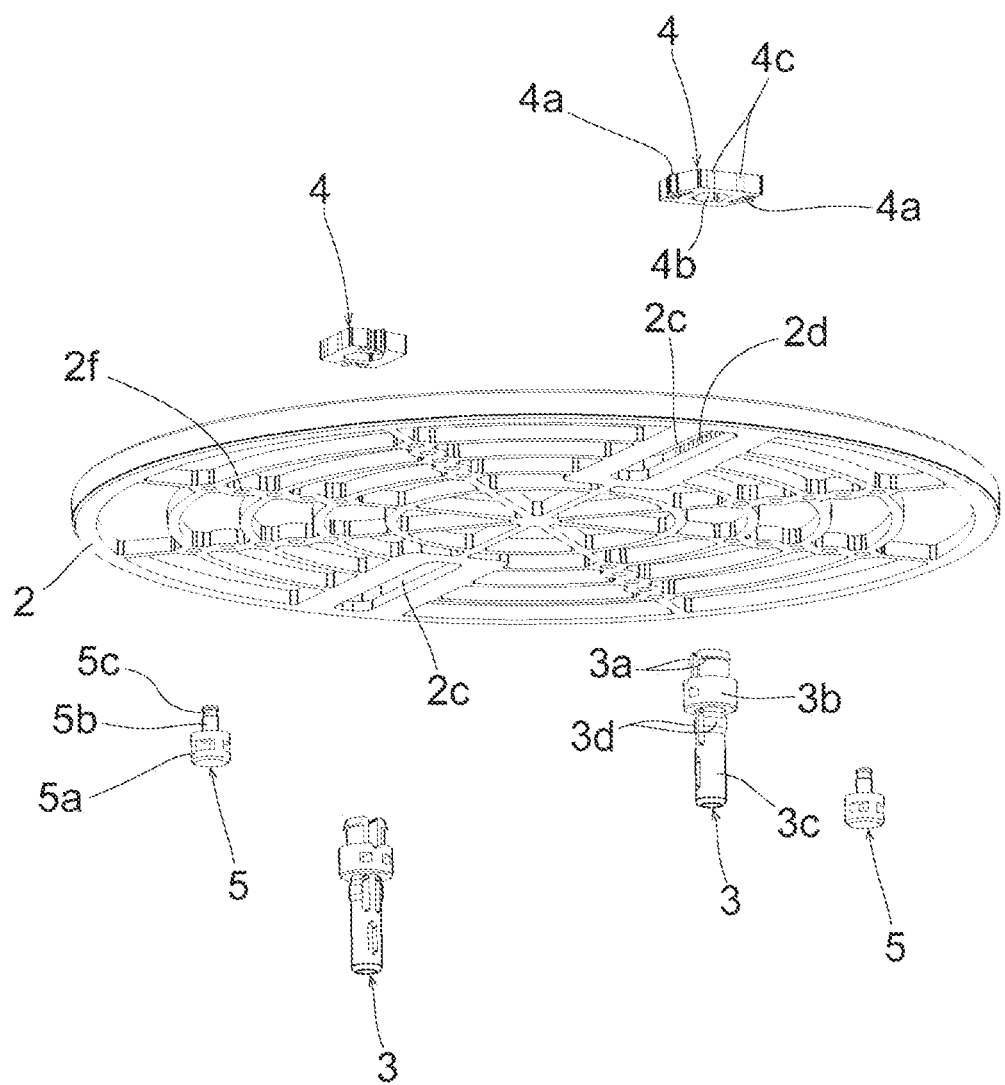
FIG. 4 is an exploded perspective view of the probe cover 1 as seen from the lower side.
Figure 5:
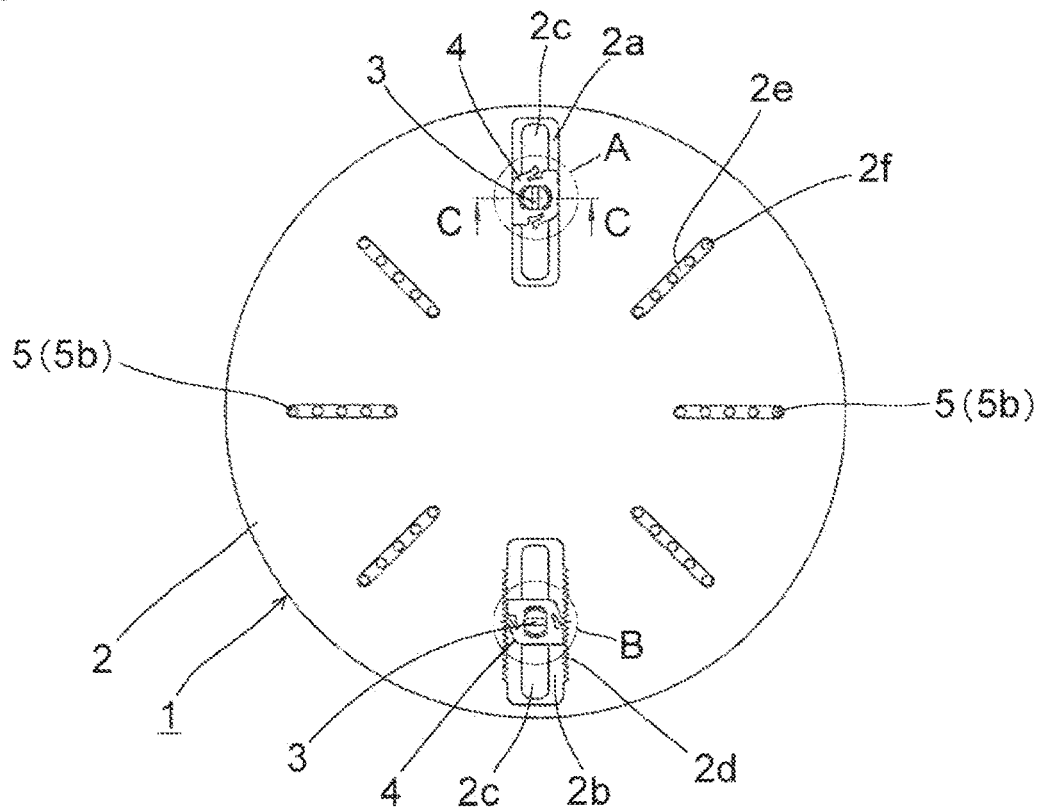
FIG. 5 is a plan view of the probe cover 1.
Figure 6:
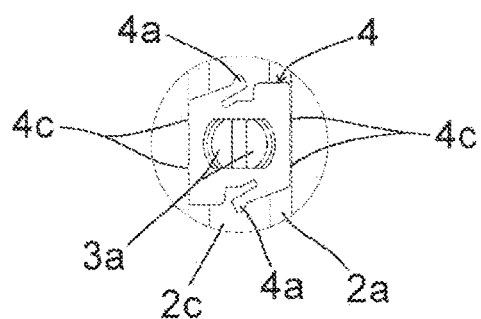
FIG. 6 is an enlarged view of part A in FIG. 5.
Figure 7:
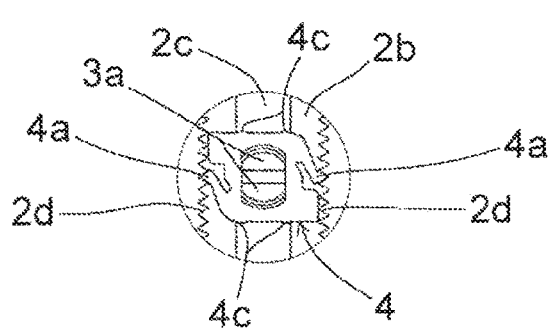
FIG. 7 is an enlarged view of part B in FIG. 5 (a locked state).
Figure 8:
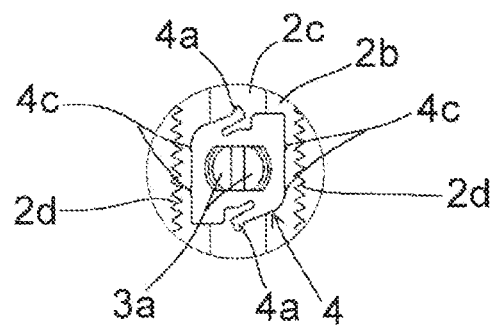
FIG. 8 is an enlarged view of part B in FIG. 5 (an unlocked state).
Figure 9:
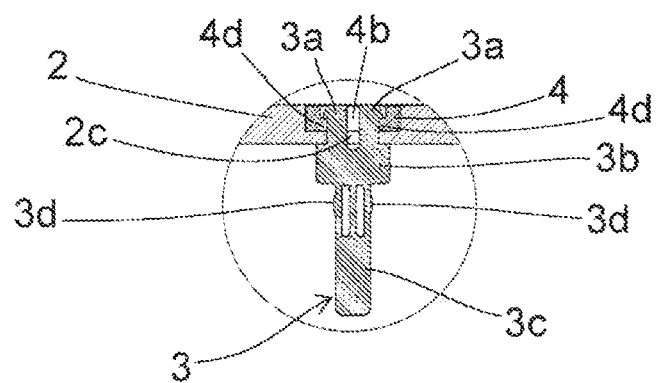
FIG. 9 is a sectional view taken along C-C in FIG. 5.
Figure 10:
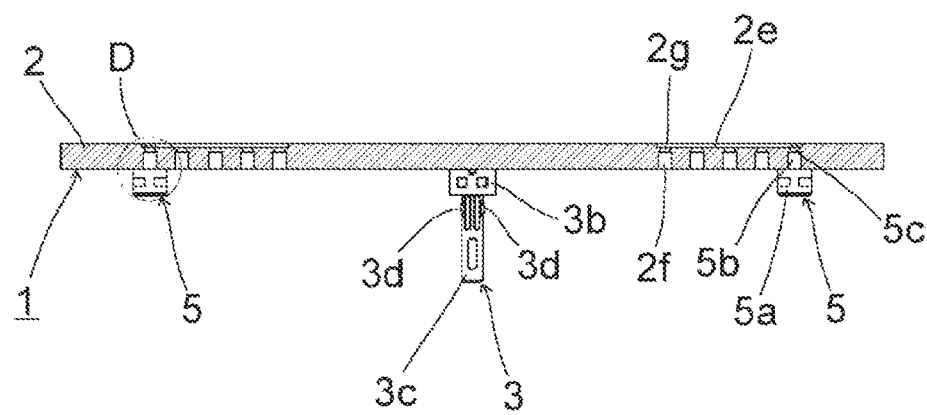
FIG. 10 is a front sectional view of the probe cover 1.
Figure 11:
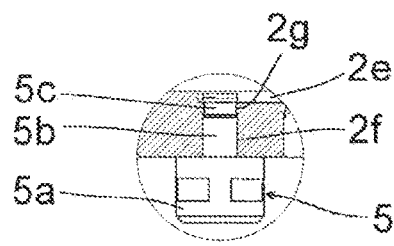
FIG. 11 is an enlarged view of part D in FIG. 10.
Figure 12:
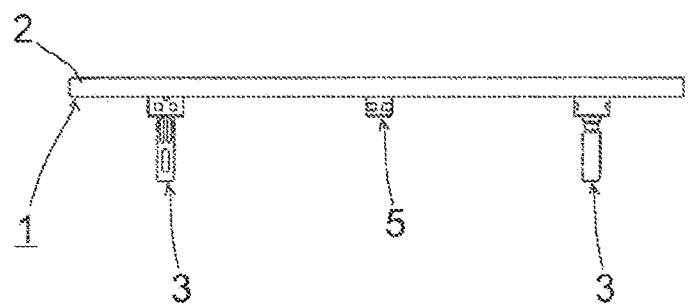
FIG. 12 is a right side view of the probe cover 1.
Figure 13:
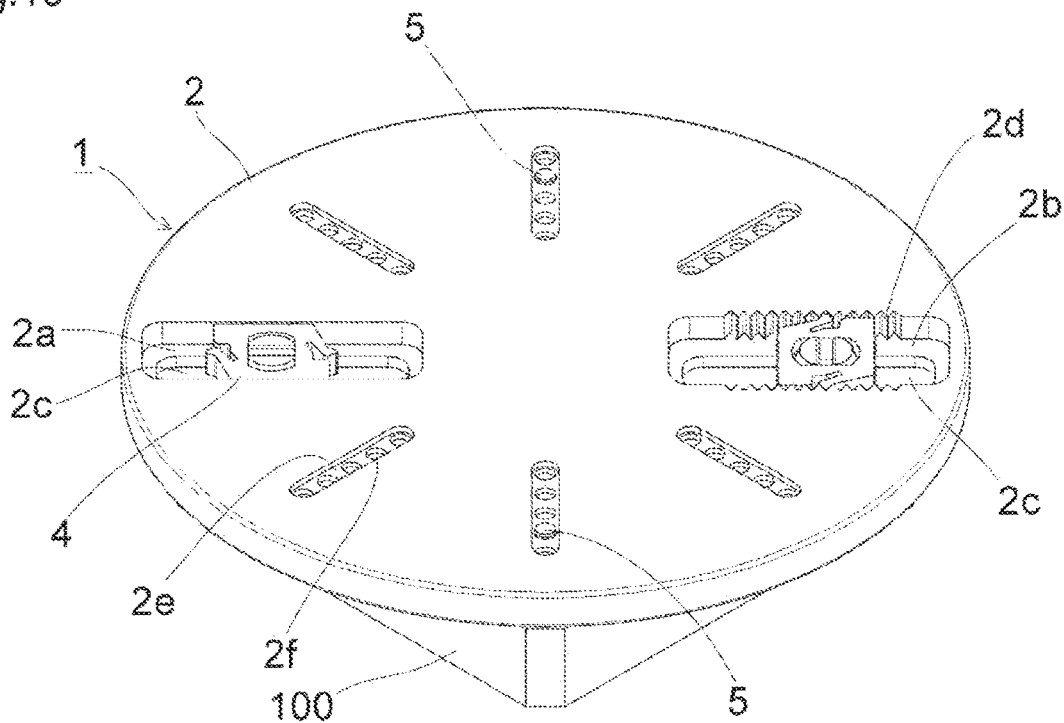
FIG. 13 is a perspective view of a state where the probe cover 1 is attached to a socket 100, as seen from the upper side.
Figure 14:
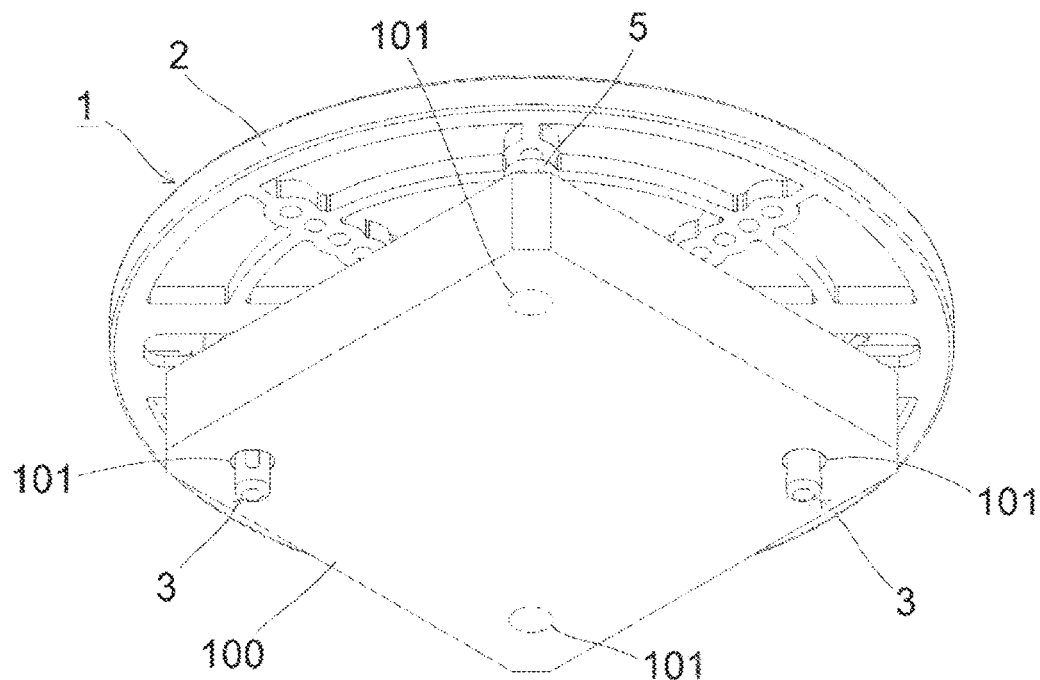
FIG. 14 is a perspective view of the state where the probe cover 1 is attached to a socket 100, as seen from the lower side.
Figure 15:
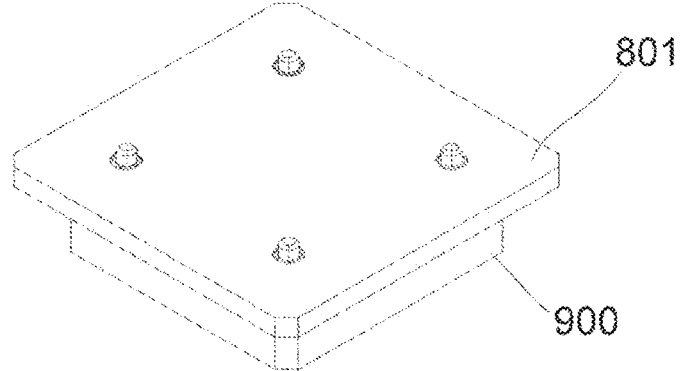
FIG. 15 is a perspective view of a state where a conventional probe cover 801 is screwed to a socket 900, as seen from the upper side.
Figure 16:
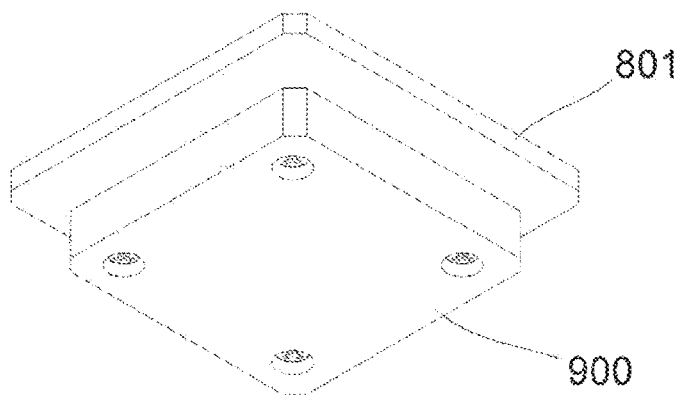
FIG. 16 is a perspective view of the state where a conventional probe cover 801 is screwed to a socket 900, as seen from the lower side.

FIG. 1 is a perspective view of a probe cover 1 according to the embodiment of the present invention as seen from the upper side. FIG. 2 is a perspective view of the probe cover as seen from the lower side. FIG. 3 is an exploded perspective view of the probe cover 1 as seen from the upper side. FIG. 4 is an exploded perspective view of the probe cover 1 as seen from the lower side. FIG. 5 is a plan view of the probe cover 1. In FIG. 5, stand pins 5 are highlighted by hatching. FIG. 6 is an enlarged view of part A in FIG. 5. FIG. 7 is an enlarged view of part B in FIG. 5 (a locked state). FIG. 8 is an enlarged view of part B in FIG. 5 (an unlocked state). FIG. 9 is a sectional view taken along C-C in FIG. 5. FIG. 10 is a front sectional view of the probe cover 1. FIG. 11 is an enlarged view of part D in FIG. 10. FIG. 12 is a right side view of the probe cover 1. FIG. 13 is a perspective view of a state where the probe cover 1 is attached to a socket 100, as seen from the upper side. FIG. 14 is a perspective view of the state where the probe cover 1 is attached to a socket 100, as seen from the lower side.

The probe cover 1 is attached to the socket 100 that supports a plurality of contact probes, to protect the tip ends of the contact probes which are projected from the socket 100. In FIGS. 13 and 14, the contact probes supported by the socket 100 are not illustrated. The probe cover 1 may include a base 2, two positioning pins 3 having the same shape, two positioning pin holders 4 having the same shape, and two stand pins 5 which serves as the supporting members, and which have the same shape. Although the shape and color of the base 2 are not particularly limited, the base is preferably formed as a transparent resin molded body having a disk-like shape. In the embodiment, the base is formed as described above. All the positioning pins 3, the positioning pin holders 4, and the stand pins 5 are formed, for example, as resin molded bodies.

The base 2 has a sliding guide groove 2a and a sliding lock groove 2b. In each of the bottom portions of the sliding guide groove 2a and the sliding lock groove 2b, a sliding guide hole 2c which functions as the guiding portion is disposed. The widths in the short-side direction (the widths in a direction perpendicular to a sliding direction) of the sliding guide holes 2c are smaller than the widths of the sliding guide groove 2a and the sliding lock groove 2b in the same direction. In order to enable the below-described positioning pin holders 4 to be rotatable, the width in the short-side direction of the sliding lock groove 2b is larger than that in the same direction of the sliding guide groove 2a. The sliding guide groove 2a, the sliding lock groove 2b, and the both sliding guide holes 2c are disposed on the same straight line which passes through the center of the base 2. In the both side walls of the sliding lock groove 2b, locking rack portions 2d are disposed along the sliding direction, respectively.

The base 2 has a plurality of recesses 2e. The recesses 2e radially elongate from the inner side of the base 2 toward the outer side. In each of the bottom portions of the recesses 2e, a plurality of stand pin locking holes 2f which serves as the plurality of mounting holes are disposed. In the illustrates example, three recesses 2e are disposed at equiangular intervals in circumferential direction on each side of a straight line passing through the sliding guide groove 2a and the sliding lock groove 2b. Five stand pin locking holes 2f are disposed in the bottom surface of each of the recesses 2e.

Each of the positioning pins 3 has a pair of nail portions 3a, a base portion 3b, and a pin body portion 3c. The pair of nail portions 3a is upward erected from the base portion 3b. The pin body portion 3c has, for example, a columnar shape, and is downward erected from the base portion 3b. The outer diameter of the pin body portion 3c is smaller than that of the base portion 3b. The lower end surface of the base portion 3b functions as a placing surface for the socket 100 (FIGS. 13 and 14). The pin body portion 3c has a socket locking projection 3d on the outer circumferential surface in the vicinity of the base portion 3b.

The positioning pin holders 4 are housed inside of the sliding guide groove 2a and the sliding lock groove 2b, respectively. Preferably, the upper surfaces of the positioning pin holders 4 are substantially flush with the upper surface of the base 2. Each of the positioning pin holders 4 has a pair of tongue piece portions (nail portions) 4a, a positioning pin lock hole 4b, and a predetermined number of ridges 4c. The pair of tongue piece portions 4a is locked at a predetermined rotation position by the locking rack portions 2d of the sliding lock groove 2b (FIG. 7). The locking rack portions 2d and the tongue piece portions 4a function as locking units for locking the positioning pins 3 at arbitrary sliding positions. The positioning pin lock hole 4b is disposed in the middle of the positioning pin holder 4. As illustrated in FIG. 9, a pair of locking projections 4d is disposed on the inner surface of the positioning pin lock hole 4b to lock the pair of nail portions 3a of the positioning pin 3. In the positioning pin holder 4, as illustrated in FIG. 3 and the like, two ridges 4c that elongate vertically are disposed on each of the side surfaces on which the tongue piece portions 4a are not disposed. The ridges 4c have a function of preventing the positioning pin holder 4 in the sliding guide groove 2a from rattling (FIG. 6).

Each of the stand pins 5 has a stand portion 5a and a locking pin portion 5b. The locking pin portion 5b has, for example, a columnar shape, and is erected from the middle of the upper surface of the stand portion 5a. A locking recess 5c is disposed on the outer circumferential surface in the vicinity of the tip end of the locking pin portion 5b. As illustrated in FIG. 11, the locking recess 5c is fitted to a squeezed portion 2g of the stand pin locking hole 2f to function as a slipping-off preventing portion for the stand pin 5.

A procedure of assembling the probe cover 1, and that of attaching the probe cover to the socket 100 will be described.

First, the pair of nail portions 3a of each of the positioning pins 3 is positioned within the sliding guide groove 2a from the lower side through the sliding guide hole 2c formed in the bottom surface of the sliding guide groove 2a. Then, the positioning pin holder 4 is inserted from the upper side into the sliding guide groove 2a, and the pair of nail portions 3a of the positioning pin 3 is engaged with the pair of locking projections 4d in the positioning pin lock hole 4b. In this state, as illustrated in FIG. 9, the upper end surface of the base portion 3b of the positioning pin 3 is butted against the lower end surface (the surface surrounding the sliding guide hole 2c) of the base 2. In this way, the pair of locking projections 4d of the positioning pin holder 4, and the circumference of the sliding guide hole 2c are clamped by the pair of nail portions 3a and the upper end surface of the base portion 3b, and the positioning pin 3 is slidable (supported so as to be slidable with respect to the base 2)

with a constant sliding resistance together with the positioning pin holder 4 along the sliding guide groove 2a and the sliding guide hole 2c.

Also the other positioning pin 3 and the other positioning pin holder 4 are attached to the base 2 in a similar procedure. When the positioning pin holder 4 is inserted from the upper side into the sliding lock groove 2b, however, the rotation position of the positioning pin holder 4 is set as illustrated in FIG. 8 (the tongue piece portions 4a are not engaged with the locking rack portions 2d). According to the configuration, the other positioning pin 3 is slidable (supported so as to be slidable with respect to the base 2) with a constant sliding resistance together with the positioning pin holder 4 along the sliding guide groove 2c in the sliding lock groove 2b. The positioning pins 3 and the positioning pin holders 4 may be first attached to either of the sliding guide groove 2a and the sliding lock groove 2b.

After the two positioning pins 3 and the two positioning pin holders 4 are attached to the base 2, the positioning pins 3 are slid in conformity to the positions of through holes of the socket 100 which is the attachment destination of the probe cover 1, and the positioning pin 3 and positioning pin holder 4 on the side of the sliding lock groove 2b are rotated by 90°, thereby changing the state from the unlocked state illustrated in FIG. 8 to the locked state illustrated in FIG. 7. This causes the positioning pin 3 and positioning pin holder 4 on the side of the sliding lock groove 2b are locked to the current sliding position. Even in the case where the sliding position is slightly deviated when the positioning pin 3 and positioning pin holder 4 on the side of the sliding lock groove 2b are set to the locked state illustrated in FIG. 7, this can be coped with by adjusting the sliding position of the positioning pin 3 and positioning pin holder 4 which are on the side of the sliding guide groove 2a, and which are always slidable.

Next, two stand pins 5 are attached to the base 2. The locking pin portion 5b of each of the stand pins 5 is inserted into a desired one of the stand pin locking holes 2f of the base 2, and, as illustrated in FIG. 11, the locking recess 5c of the locking pin portion 5b, and the squeezed portion 2g of the stand pin locking hole 2f are fitted to each other, thereby locking the stand pin 5 to the stand pin locking hole 2f. The tip end of the locking pin portion 5b is located in the recess 2e of the base 2, and does not protrude from the upper surface of the base 2. The attaching positions (stand pin locking holes 2f to which the stand pins are to be attached) of the two stand pins 5 are adequately determined in accordance with the shape of the socket 100 which is the attachment destination of the probe cover 1. Alternatively, the stand pins 5 may be first attached to the base 2 before the positioning pins 3 and the positioning pin holders 4 are attached to the base 2.

When the two positioning pins 3, the two positioning pin holders 4, and the two stand pins 5 are attached to the base 2 (when the assembling of the probe cover 1 is completed), the probe cover 1 is attached to the socket 100 as illustrated in FIGS. 13 and 14. Specifically, the pin body portion 3c of each of the positioning pins 3 is inserted into the through hole 101 of the socket 100, and the socket locking projection 3d of the pin body portion 3c is fitted into the through holes 101. Then, the socket locking projection 3d presses the inner surface of the through hole 101, and exerts a constant resistance force against slipping-off to lock the pin body portion 3c to the through hole 101, and prevent the probe cover 1 from rattling with respect to the socket 100. When the pin body portion 3c is inserted up to the end of the through holes 101, the lower end surface of the base portion 3b of the positioning pin 3, and that of the stand portion 5a of the stand pin 5 are contacted with the upper surface of the socket 100. In this way, the probe cover 1 is positioned and attached to the socket 100 by the two positioning pins 3, the two positioning pin holders 4, and the two stand pins 5 in a state where the lower surface of the base 2 is separated by a constant distance from the upper surface of the socket 100.

A procedure of detaching the probe cover 1 from the socket 100, and that of disassembling the probe cover will be described.

When, while holding the base 2, a force of a constant level or higher is applied to the prove cover 1 in the direction along which the probe cover 1 is separated from the socket 100, the pin body portions 3c of the positioning pins 3 are pulled out from the through holes 101 of the socket 100, and the probe cover 1 is separated from the socket 100. When the positioning pin 3 on the side of the sliding lock groove 2b is rotated by 90°, the engagement between the positioning pin holder 4 and the locking rack portion 2d is cancelled (FIG. 7→FIG. 8). When the positioning pin 3 is downward pulled while pressing and shortening the pair of nail portions 3a of the positioning pin 3, the positioning pin 3 is separated from the positioning pin holder 4 and the base 2, and the positioning pin holder 4 becomes separable from the sliding guide groove 2a and the sliding lock groove 2b. When the stand pin 5 is downward pulled by a force of a constant level or higher while holding the stand portion 5a, the stand pin 5 is separated from the base 2.

According to the embodiment, the following effects can be achieved.

(1) The mutual separation distance between the two positioning pins 3 can be changed. When the mutual separation distance between the two positioning pins 3 is adjusted in accordance with the positions of the through holes 101 of the sockets 100 which is the attachment destination of the probe cover 1, therefore, the probe cover 1 can be attached to socket 100 having different sizes and various shapes (the versatility of the probe cover 1 is enhanced). Consequently, it is not necessary to custom-design probe covers conforming to respective sockets, and therefore design man-hours and the production cost can be reduced.

(2) When the probe cover 1 is to be attached to the socket 100, fixation by screwing or the like is not necessary. Therefore, works of attaching and detaching the probe cover to the socket 100 are easily performed.

(3) The mutual separation distance between the two positioning pins 3 can be selected from continuous values by means of sliding. As compared with the case where the mutual separation distance is selected from discrete values, therefore, the positioning pins 3 can be surely positioned with respect to the through holes 101 of the socket 100.

(4) One of the positioning pins 3 can be locked at an arbitrary sliding position by engaging the pair of tongue piece portions 4a of the positioning pin holder 4 with the locking rack portions 2d of the sliding lock groove 2b. After the probe cover 1 is attached to the socket 100, therefore, sliding of the positioning pin 3 along the sliding guide hole 2c (namely, sliding of the base 2 with respect to the socket 100) can be prevented from occurring.

(5) The attachment destinations of the two stand pins 5 can be arbitrarily selected from the many stand pin locking holes 2f. Therefore, the two stand pins 5 can be adequately placed in accordance with the various shapes of sockets 100.

(6) The probe cover 1 is contacted with the upper surface of the socket 100 through the four places, i.e., the two positioning pins 3 and the two stand pins 5. Therefore, a posture in which the base 2 is parallel to the upper surface of the socket 100 can be easily maintained.

(7) The base 2 has a disk-like shape. Unlike the case where the base 2 has a quadrangular shape such as a square or a rectangle, therefore, there does not arise a problem in that rotation positions do not coincide with the socket 100 which often has a quadrangular shape such as a square or a rectangle as seen from the upper side.

(8) Since the base 2 is transparent, it is possible to visually check the through holes 101 of the socket 100 through the base 2, and hence the workability in attachment of the probe cover 1 to the socket 100 is high.

Although the present invention has been described with reference to the embodiment, it is obvious to those skilled in the art that the components and processes of the embodiment can variously modified within the scope of the claims. Hereinafter, modifications will be described.

The two positioning pins 3 may have different shapes. This is similarly applicable also to the two positioning pin holders 4 and the two stand pins 5.

REFERENCE SIGNS LIST

1 probe cover, 2 base, 2a sliding guide groove, 2b sliding lock groove, 2c sliding guide hole, 2d locking rack portion, 2e recess, 2f stand pin locking hole, 2g squeezed portion, 3 positioning pin, 3a nail portion, 3b base portion, 3c pin body portion, 3d socket locking projection, 4 positioning pin holder, 4a tongue piece portion, 4b positioning pin lock hole, 4c ridge, 4d locking projection, 5 stand pin, 5a stand portion, 5b locking pin portion, 5c locking recess, 100 socket, 101 through hole, 801 probe cover, 900 socket

The invention claimed is:

1. A probe cover which is to be attached to a socket that is configured to support a plurality of contact probes, the prove cover comprising:
   a base;
   two positioning pins which are disposed on the base; and
   at least one supporting member which is disposed on the base, wherein
   the two positioning pins and the supporting member are capable of positioning the base in a state where the base is separated from the socket by a predetermined distance, and
   the two positioning pins are configured to move on the base according to a size of the socket so as to attach the probe cover to the socket,
   wherein the base includes guiding portions which are configured to slidably support the two positioning pins, respectively;
   wherein the probe cover further includes a locking unit which is configured to lock one of the two positioning pins at an arbitrary sliding position, and
   wherein the probe cover protects tip ends of the contact probes, which are projected from the socket, when the socket is in a packaged state for shipping or in a unused state.

2. The probe cover according to claim 1, wherein a mutual separation distance between the two positioning pins is selectable from continuous values.

3. The probe cover according to claim 1, wherein both the guide portions are disposed on a same linear line.

4. The probe cover according to claim 1, wherein the base has a plurality of mounting holes, and the supporting member is attachable to an arbitral one of the mounting holes.

5. The probe cover according to claim 1, wherein two supporting members are included, and the two supporting members are placeable respectively on both sides of a linear line passing through the two positioning pins.

6. The probe cover according to claim 1, wherein the base has a disk-like shape.

7. The probe cover according to claim 1, wherein the base is transparent.

8. The probe cover according to claim 1, wherein the two positioning pins are moved by sliding them on guarding portions formed on the base.

9. The probe cover according to claim 8, wherein the guiding portions respectively include elongated holes, and the two positioning pins slide in the respective elongated holes.

10. The probe cover according to claim 8, further comprising positioning pin holders that hold the two positioning pins and are housed inside the guarding portions.

11. The probe cover according to claim 1, wherein the two positioning pins extend in a first direction, and wherein a distance between the two positioning pins is changeable in a second direction perpendicular to the first direction.

12. A probe cover which is to be attached to a socket that is configured to support a plurality of contact probes, the prove cover comprising:
   a base;
   two positioning pins which are disposed on the base; and
   at least one supporting member which is disposed on the base, wherein
   the two positioning pins and the supporting member are capable of positioning the base in a state where the base is separated from the socket by a predetermined distance, and
   the two positioning pins are configured to move on the base according to a size of the socket so as to attach the probe cover to the socket;
   wherein the base includes guiding portions which are configured to slidably support the two positioning pins, respectively;
   wherein the probe cover further includes a locking unit which is configured to lock one of the two positioning pins at an arbitrary sliding position, and
   wherein each of the two positioning pins includes a socket locking projection that is configured to allow the probe cover to be attached to and detached from the socket.

* * * * *